United States Patent [19]
Bentz et al.

[11] Patent Number: 4,605,986
[45] Date of Patent: Aug. 12, 1986

[54] COOLED ELECTRICAL CIRCUIT COMPONENT, PARTICULARLY SWITCHING-TYPE SEMICONDUCTOR

[75] Inventors: Willy Bentz, Sachsenheim; Willi Gansert, Kornwestheim; Gert Jakob, Stuttgart; Kurt Stammler, Schwieberdingen; Christoph Walter, Vaihingen, all of Fed. Rep. of Germany

[73] Assignee: Robert Bosch GmbH, Stuttgart, Fed. Rep. of Germany

[21] Appl. No.: 684,091

[22] Filed: Dec. 20, 1984

[30] Foreign Application Priority Data

Mar. 13, 1984 [DE] Fed. Rep. of Germany ....... 3409037

[51] Int. Cl.$^4$ .............................................. H05K 7/20
[52] U.S. Cl. ..................... 361/386; 357/81; 361/387
[58] Field of Search ................... 363/141, 144; 174/16 HS; 361/386, 387, 388; 357/75, 79, 81

[56] References Cited

U.S. PATENT DOCUMENTS

| | | | |
|---|---|---|---|
| 2,881,364 | 4/1959 | Demer | 361/386 |
| 3,495,131 | 2/1970 | Metcher | 361/386 |
| 3,519,889 | 7/1970 | Monaco | 361/388 |
| 3,864,607 | 2/1975 | Phillips | 361/388 |
| 4,128,870 | 12/1978 | Knobloch | 363/141 |
| 4,224,663 | 9/1980 | Maiese | 361/388 |

OTHER PUBLICATIONS

"Spring-Clip—Heat Sink", Almquist, IBM Tech Discl Bull, vol. 23, No. 12, May 1981, p. 5303.

Primary Examiner—G. P. Tolin
Attorney, Agent, or Firm—Frishauf, Holtz, Goodman & Woodward

[57] ABSTRACT

To increase the heat capacity of a heat sink and heat dissipating structure combined with an electrical component, typically a transistor, for example of the TO 220 or SOT 93 type, a heat transferring base plate (3), with the interposition of an insulating, heat conducting foil (6), engages one flat surface of the element (11), and a second heat transferring element (17) is provided, pressed by a spring (24) against the other major surface, or a portion of the component (11). A plastic holder (7) is provided, attached to the base plate (3) for example by snap-in hooks (8), formed with openings to receive the component, and position the component against the base plate while, also, being formed with abutments to position the second heat transferring element which, for example, is block or plate-like. The spring, preferably, is a leaf spring having projecting arms extending, from both sides of a central portion (25), over two adjacently located components (11) and the second heat transferring elements (17) respectively, and engaging the holder (7) to form a subassembly therewith, the subassembly then being riveted, by rivets extending through the spring (24) to the base plate.

18 Claims, 5 Drawing Figures

4,605,986

COOLED ELECTRICAL CIRCUIT COMPONENT, PARTICULARLY SWITCHING-TYPE SEMICONDUCTOR

The present invention relates to an electrical circuit component which, in operation, generates heat, and more particularly to a cooled switching semiconductor, for example a switching transistor.

BACKGROUND

Semiconductor elements, particularly transistors, thyristors, and the like, become hot during operation due to inherent losses within the semiconductor. It is known to intimately associate the semiconductor chip itself with heat sinks and heat radiators, for example finned radiators, and other heat transmitting elements which are capable of transferring the heat which is generated within the component to external heat sinks or radiators. In one such structure, the semiconductor is plate-like and is secured to a heat transmitting element which, itself, may operate as a heat sink. The semiconductor is located in lateral position on the heat sink element by a plastic housing, and pressed against the heat sink by a spring. In transistors, for example of the type TO 220, or SOT 93, which have housings which may heat substantially for short periods of time, the cooling element attached to the housing is not sufficient to carry off all generated heat.

THE INVENTION

It is an object to carry off heat generated by semiconductor elements which are encapsulated in a housing more efficiently and effectively than heretofore possible and, particularly, to carry off sudden heat overloads or heat peaks or heat spikes which may occur, and thereby prevent damage to, or destruction of, the electrical component.

Briefly, the electrical circuit component which has a plate-like housing or outer configuration is pressed against a flat engagement surface of a heat sink or heat transmitter by a spring; in accordance with the present invention, a second heat transferring element is located at the side of the semiconductor opposite the heat sink, the spring engaging the second heat transferring element so that the electrical component is sandwiched between two heat transferring elements, and held securely under spring pressure between the two heat transferring elements. The second heat transferring element can be positioned and connected in heat transferring relationship to the first so that, if the first is of the heat-sink type, having heat storage and dissipating capacity, sudden heating overloads of the component can be carried away by the second heat transferring element to the first, for ultimate dissipation by the first and the second.

The arrangement has the advantage that sudden thermal overloads can be rapidly conducted away even from semiconductors which are within a plate housing, by increasing the available surface for heat transmission from the semiconductor element, and conducting heat from the second surface of the semiconductor directly to the second element against which the semiconductor is engaged. Preferably, the additional heat conducting or heat transferring element is held by the same spring which also presses the semiconductor element against the base plate; the spring is then preferably secured to the base plate so that a self-holding composite structure is obtained which is easily made and assembled, the spring holding the entire unit in positioned alignment.

In accordance with a preferred feature of the invention, a locating plastic holder is provided which is secured to the base plate, which functions simultaneously as a first heat transferring element, preventing movement of the electrical component and thus also preventing damage to a housing thereof by contact with the respective heat transferring elements. Due to differential thermal expansion, the spring presses the heat transferring elements together, with the electrical components sandwiched therebetween, but permits slight movement, and such differential expansion. The holder is preferably provided with an elastic portion over which the spring presses against the additional heat transferring element. The holder can be snapped into the base plate, and the holder may, further, function as the attachment element of the spring to the base plate, so that the spring is removably secured to the base plate with the intermediate structure of the holder. The spring element preferably presses against the electrical component with a higher spring force than heretofore customary by engaging the additional heat transferring element with the higher force. This prevents damage due to possible tilting or twisting torques applied on the component by the spring, and, additionally, insures reliable assembly of the entire cooling structure - component combination by the spring. The direct attachment of the spring, either directly to the base plate forming the first heat transferring element, or to the intermediate holder, permits inexpensive mass production and assembly of the elements in position.

DRAWINGS

DETAILED DESCRIPTION

Figure 1:
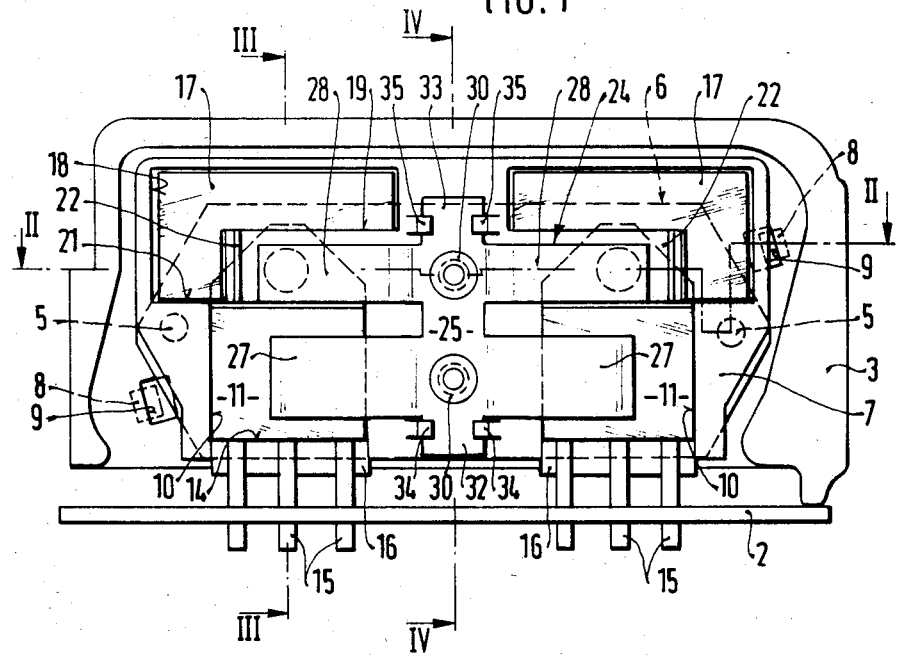
FIG. 1 is a schematic side view in which the electrical components are plate-like transistors, illustrating the combination of the electrical components with the cooling structure.

FIG. 1 illustrates an electrical circuit element cooling structure combination. Two electrical circuit elements shown as transistors 11, retained in plate-like housings, are located within a cooling frame 1 (FIGS. 3, 4) which has a base plate 3 (FIGS. 1, 2) defining an interior engagement surface 4. By way of example, the circuit components 11 are transistors of the type SOT 93 which are to be cooled by the transistor cooling structure combination. The frame 1 can be attached to a printed circuit board (PCB) 2, which carries printed circuit conductors or tracks as is well known, and which may be made in accordance with any suitable arrangement. The transistors are electrically connected by connecting terminals 15 to respective conductors in the PCB 2.

The first cooling element 3 secured to the frame 1, with the engagement surface 4, is formed with two locating projections 5 (FIGS. 1, 2) which retain a heat conductive, but electrically insulated foil 6 serving as an insulating layer which may also be of an insulated heat conductive pasteous material, and a holder 7, made of insulating plastic, in position on the first cooling and heat transferring element 3.

Figure 2:
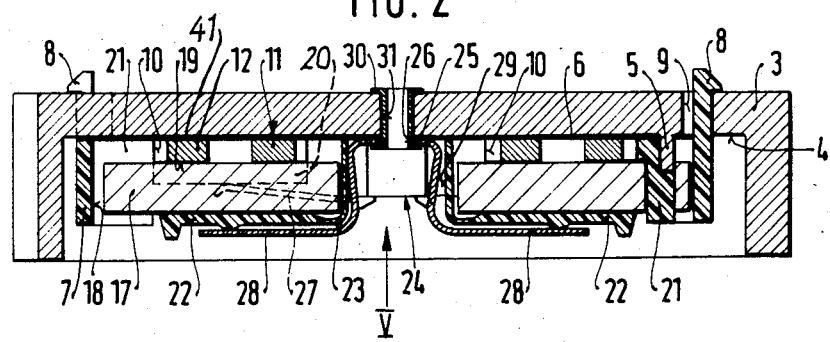
FIG. 2 is a cross section along line II—II which, as shown in FIG. 1, is not a straight line but, rather, is carried through an angled and offset course to facilitate the illustration.
Figure 3:
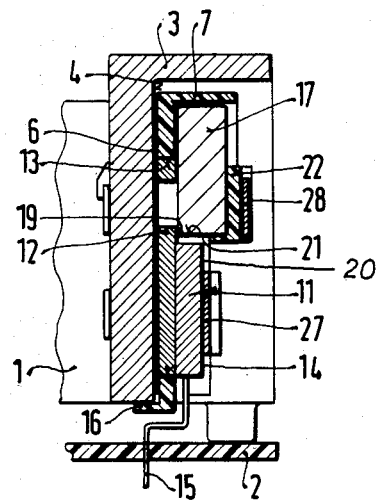
FIG. 3 is a cross section along line III—III, which is a straight line.
Figure 4:
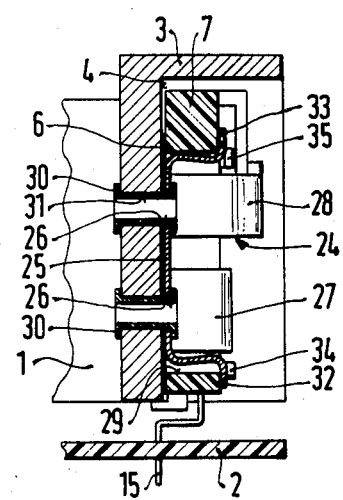
FIG. 4 is a cross section along line IV—IV, which is straight.

The holder 7 is formed with two snap hooks S which extend through suitable holes 9 in the first transferring element 3. The heat transferring element 3 forms a base plate for the entire structure. The snap hooks 8 snap over the edges of the holes 9 in the back of the base plate 3 - see FIG. 2. The snap hooks 8, thus, are provided for pre-assembling the holder 7 to the base plate 3. The holder 7 is formed with two openings 10, shaped and dimensioned to hold the components 11 in position. As shown, and when using transistors of the type SOT 93, the openings can be rectangular, with an extension to fit projections 15 therein, see FIG. 1. The components 11 have a base plate 12 of metal which is engaged by the foil 6 and, thus, provides for heat transfer through the foil 6 while also insuring electrical insulation. If electrical insulation is not needed, foil 6 can be omitted. The holder 7 has stops 13, 14 (FIG. 3) molded thereon, limiting the openings 10, and preventing movement of the components 11 in the holder 7 and on the insulating foil 6, and hence on the engaging cooling and heat transferring surface 4. The holder 7 is formed with insulating portions 16 in the region of the connecting electrodes 15 (FIG. 1) of the components 11, the portions 16 engaging around the bottom of the base plate 3 - see FIG. 3. The connecting electrodes 15 of the transistors 11 are offset and angled, as seen in FIG. 3, and connected, as is well known, with appropriate conductors on the PCB 2 for electrical and mechanical connection thereto.

The components 11 are spring-pressed against the base plate 3 in order to insure good heat transition, and conduction of heat due to heating losses within the components, with the foil 6 sandwiched between the base plate 3 and the components 11, if required. Electrical switching semiconductors may, under some conditions, be subjected to sudden peak heating overloads, for very short periods of time. Frequently, the cooling base plate 3 is not sufficient in order to conduct off the substantial heat generated within the elements 11, which may lead to damage or even destruction of semiconductor elements.

In accordance with the present invention, and in order to increase the heat acceptance capacity, a second heat transferring element 17 is engaged against the components 11 at the side remote from the base plate 3. The second element 17 is a metal plate, which need not be insulated. The second heat transferring element is secured in a recess 18 (FIG. 1) of the holder 7, and engages the side 19 of the base plate 12 of the component 11 in the region in which the base plate 12 extends out from the plastic housing 20 of the transistor SOT 93 forming the element 11. The second heat transferring element 17 is limited in its movement by a stop 21 (FIG. 1) of the holder 7, to prevent any damage. The holder 7 has elastic flaps 22 (FIG. 2) formed thereon which are secured by a "living hinge" 23 to pivot about the holder 7. The second heat transferring elements 17 are pressed by spring force against the base plate 12 of the associated component 11. The spring force acts against the second heat transferring elements 17 at the side remote from the base plate 12 and against the plastic flaps 22, see FIG. 2, and thus simultaneously holds the second heat transferring elements in position in the holder 7

The engagement force between the components 11 and the first and second heat transfer elements 3, and 17, respectively, is exerted by a spring 24. The spring 24 has an approximately rectangular attachment portion 25 formed with two attachment holes 26. The cross-sectional shape of the spring is best seen in FIG. 2. Two angled-off spring arms 27, 28 are connected to each of the longitudinal sides of the attachment portion 25. The spring arms 27 engage the plastic housing portion 20 of the respective components 11; the narrower spring arms 28, which exert a lesser spring force, engage the flaps 22. The spring arms 28 rotate the flaps 22 about the respective living hinges 23 upon insertion of the spring element 24 into the holder 7. The spring element 24 is fitted in a recess 29 of the holder 7 by engagement of the attachment portion 25 with the recess. Two eyelet rivets 30, extending through the holes 26 and through holes 31 of the first heat transfer element or base plate 3 attach the spring to the holder 7 and, respectively, to the base plate 3. The eyelets are riveted over in the back of the base plate 3 - see FIG. 2.

The narrow sides of the rectangular attachment portion 25 of the spring element 24 are formed with L-shaped engagement portions 32, 33, which fit behind engagement projections 34, 35 of the holder 7. By this arrangement, the spring 24 will already form a subassembly of the insulating foil 6, holder 7, electronic components 11, and the second heat transfer element 17, together with the spring element 24, even before the spring, and with it the subassembly, is riveted to the base plate 3, to complete the entire cooling arrangement.

Semiconductor switching elements, or other electrical components may have short-time peak heating periods. Such peak heat occurrence can be transferred not only to the base plate 3, with the foil 6 interposed and conducted away by the base plate 3, but, also, to the second heat transfer element 17, where it can be absorbed and dissipated. The heat applied to the second heat transfer element 17 can then be conducted off towards the first heat transfer element or the base plate 3, or radiated. In switching operation, heat will reach high levels only for very short periods of time, so that, if a cool body is available, such heat can be removed rapidly from the component 11, for storage and radiation. The heat capacity of the overall structure, including the base plate 3 and the second heat transfer element 17, thus is substantially increased with few additional structural requirements, permitting removal of peak pulses from the electrical component 11 rapidly and effectively.

Various changes and modifications may be made; for example, the second heat transfer element 17 can be so shaped that it is suitable to carry away heat of two or more electrical components 11, and form a heat sink for generated heat. The spring 24, of course, can be shaped to engage only one element 11, or to engage more than one, two, or any other plurality. Attachment portions similar to portion 25 can be formed at the end of the arms 28, and the structure can be multiplied laterally with respect to FIG. 1.

The engagement of the projecting portions 32, 33 of the spring 24 with the projections 34, 35 on the holder 7 insure uniformity of loading of the spring even if non-symmetrical tilting torques should occur. Such non-symmetrical tilting torques can arise due to differences in spring force of the spring arms or pairs of spring arms 27, 28, as well as non-symmetrically formed arms 27, 28 - with respect to the attachment portion 25 - for example due to inaccuracies in manufacture. Also, non-symmetrical loading may occur if the structure is made as illustrated, under mass-production conditions, but only one component 11 is inserted.

Figure 5:
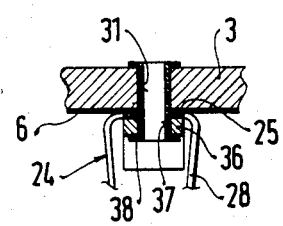
FIG. 5 is a fragmentary view through the connection of the spring to the base plate, looked at in the direction of the arrow V in FIG. 2.

For some installations, particularly when used under conditions of vibration, shock, or other rough operating conditions, for example in automotive use, the subassembly of base plate 3, foil 6, holder 7, components 11, and second heat transfer elements 17 can be held together by the spring 24 with increased reliability and resistance against vibration as shown in FIG. 5. The spring element 24 has a plate 36 located against the attachment portion 25; the plate 36 has two holes 37 which are aligned with the holes 26 of the spring 24. Eyelet rivets 38 longer than the rivets 31 (FIGS. 2, 4) are fitted through the plate 36, spring 24, and the openings 31 of the base plate 3; the eyelet rivets are riveted over the base plate 3 at the back side thereof, as seen in FIG. 5. Alternatively, the eyelets 38 can be inserted from the back plate 3 through the respective aligned holes and riveted over against the plate 36. Other arrangements are also suitable, for example the spring element 24 may be attached, removably, to the base plate 3 by screws or the like; the spring 24 may also be formed with projecting welts or strips which have springy snap-over edges pressed through the holes 31 in the base plate 3 and snapped behind the base plate 3 to hold the spring 24 releasably in position. If the base plate 3 is made of a soft metal, and the spring is made of hard spring steel, such attachments afford a reliable engagement since the sharp edges of the spring metal can bite into the softer material used as a heat sink and heat dissipating element formed by the base plate 3.

Various other changes and modifications may be made within the scope of the inventive concept.

We claim:

1. A pre-assemblable, heat-spike resistant electrical circuit component and cooling structure combination
    wherein the electrical circuit component (11) is a static, plate-like component having a thermally conductive portion (12) and two major surfaces (19, 41) and, in operating, generates heat,
    said combination having
    a first, heat-transferring, base-plate, element (3) having an engagement surface (4), the component (11) being positioned with a first major surface (41) thereof against said engagement surface (4) of the base-plate heat-transferring element (3);
    a spring (24) pressing the component (11) towards the engagement surface (4);
    and comprising, in accordance with the invention,
    a second heat-transferring element (17) positioned against the second major surface (19) of the component (11) and storing heat generated by operation of said component (11), particularly during peak operation thereof, and re-radiating said heat through said thermally conductive portion (12) of said component (11) to said base-plate element (2), thereby alleviating potentially damaging heat spikes in said component,
    a resilient insulative holder (7) partially surrounding said component (11), said second heat-transferring element (17) and said spring (24), the spring (24) engaging a portion (22) of said holder (7) adjacent to the second heat-transferring element (17) and exerting pressure thereagainst, and thus pressing the second heat-transferring element (17) against the component (11), and the component (11) against the heat-transferring base-plate element (3); and
    means (8, 30) securing at least said spring (24), holder (7), and base-plate (3) together as an assembly adapted for use as part of a larger electrical circuit;
    said spring (24) holding the component (11) between the first (3) and second (17) heat-transferring elements and in position on said base-plate heat-transferring element (3).

2. Combination according to claim 1, wherein the second heat transferring element (17) is plate-shaped.

3. Combination according to claim 1, wherein said plastic holder (7) positions the component with respect to the first heat transferring base plate element (3) and locates the first major surface of the component towards the engagement surface of the base plate heat transferring element (3).

4. Combination according to claim 3, further including interengaging interlock means (8, 9) formed on the first heat transferring base plate element (3), and said holder (4), respectively, which positively locate and hold the holder in position on said base plate (3).

5. Combination according to claim 3, further including engagement abutments (13, 14, 21) formed on the holder and engaging the component (11) to positively position the component with respect to the first and second heat transferring elements (3, 17) and inhibit relative movement of said components and said heat transferring elements along said major surfaces of the components.

6. Combination according to claim 3, wherein the holder (7) includes a movable projecting flap (22) engaging around the second major surface of the component, for positioning between the spring (24) and the component (11).

7. Combination according to claim 1, wherein the spring is a leaf spring (24) having at least one projecting leaf arm (27, 28) projecting over at least a portion of the plate-1 component.

8. Combination according to claim 3, wherein the holder (7) includes a movable projecting flap (22) engaging around the second major surface of the component, for positioning between the spring (24) and the component (11);
    and wherein the spring is a leaf spring having at least one projecting leaf arm (27, 28) extending over said flap (22).

9. Combination according to claim 3, further including interengaging projection-and-recess means (32, 33; 34, 35) formed, respectively, on the spring (24) and on said holder (7), positively locating the spring (24) with respect to said holder.

10. Combination according to claim 1, wherein the spring is a leaf spring (24) having at least two leaf arms (27, 28) one of said leaf arms (27) engaging over the component (11) and the other spring arm (28) engaging over the holder portion (22) adjacent to the second heat transferring element (17).

11. Combination according to claim 10, wherein the spring force of the first spring arm engaging over the component (11) is higher than the spring force of the second spring arm (28) engaging the second heat transferring element (17).

12. Combination according to claim 3, further including interlock means (32, 33; 34, 35) formed, respectively, on said spring (24) and said holder (7), locking the spring and holder together and permitting subassembling the holder (7) and said component (11) to the spring (24) for subsequent assembly of the holder (7) with the first heat transferring base plate element (3) and attachment of the spring to the first heat transferring base plate element.

13. Combination according to claim 1, wherein two components (11) are provided, positioned parallel to each other on said first heat transferring base plate (3), the spring (24) having a central portion located between said components (11) and projecting arm portions (27, 28) engaging laterally from the central portion;

and a second heat transferring element (17) positioned against the second major surface of each of the components, the laterally projecting portions (28) of the spring projecting from both sides and engaging over the holder portions (22) adjacent to the second heat transferring elements.

14. Combination according to claim 13, wherein the spring is formed with two further projecting arm portions (27) engaging, laterally from both sides of the central portion (25) of the spring, over the components (11).

15. Combination according to claim 1, further including an insulating foil (6) located between one major surface of the component (11) and the heat transferring base plate element (3).

16. Combination according to claim 1, wherein the component (11) is a semiconductor.

17. Combination according to claim 3, wherein the component (11) is a semiconductor.

18. Combination according to claim 13, wherein the components are semiconductors.

* * * * *